(12) United States Patent
Huang et al.

(10) Patent No.: US 11,217,525 B1
(45) Date of Patent: Jan. 4, 2022

(54) SEMICONDUCTOR STRUCTURE AND METHOD OF FORMING THE SAME

(71) Applicant: NANYA TECHNOLOGY CORPORATION, New Taipei (TW)

(72) Inventors: Sheng-Fu Huang, New Taipei (TW); Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/919,078

(22) Filed: Jul. 1, 2020

(51) Int. Cl.
| | |
|---|---|
| H01L 23/522 | (2006.01) |
| H01L 21/762 | (2006.01) |
| H01L 23/48 | (2006.01) |
| H01L 23/528 | (2006.01) |
| H01L 21/768 | (2006.01) |

(52) U.S. Cl.
CPC ........ *H01L 23/5226* (2013.01); *H01L 21/762* (2013.01); *H01L 21/76897* (2013.01); *H01L 23/481* (2013.01); *H01L 23/5283* (2013.01)

(58) Field of Classification Search
CPC ............... H01L 23/5226; H01L 23/481; H01L 23/5283; H01L 21/762; H01L 21/76897

USPC ......................................................... 257/774
See application file for complete search history.

(56) References Cited

U.S. PATENT DOCUMENTS

2021/0028148 A1* 1/2021 Wu .................. H01L 21/76852

* cited by examiner

*Primary Examiner* — Tu-Tu V Ho
(74) *Attorney, Agent, or Firm* — CKC & Partners Co., LLC

(57) ABSTRACT

A semiconductor structure includes a first wafer, a conductive via, an isolation layer, and a spacer structure. The first wafer includes a semiconductor substrate, a multi-level interconnect structure, and a dielectric layer. The semiconductor substrate has a front side and a back side. The multi-level interconnect structure is disposed over the front side of the semiconductor substrate. The dielectric layer is disposed over the back side of the semiconductor substrate. The conductive via extends from the dielectric layer to a conductive line of the multi-level interconnect structure. The isolation layer is disposed between the conductive via and the first wafer. The spacer structure is disposed between the conductive via and the isolation layer, in which the spacer structure is spaced apart from the conductive line.

19 Claims, 7 Drawing Sheets

SEMICONDUCTOR STRUCTURE AND METHOD OF FORMING THE SAME

BACKGROUND

Technical Field

The present disclosure relates to a semiconductor structure and a method of forming a semiconductor structure.

Description of Related Art

With the rapid growth of electronic industry, the development of integrated circuits (ICs) has achieved high performance and miniaturization. Technological advances in IC materials and design have produced generations of ICs where each generation has smaller and more complex circuits than the previous generation.

As the number of electronic devices on single chips rapidly increases, three-dimensional (3D) integrated circuit layouts, or stacked chip designs, have been utilized for certain semiconductor devices in an effort to overcome the feature size and density limitations associated with 2D layouts. Generally, in a 3D IC design, two or more semiconductor dies are bonded together, and electrical connections are formed between each die. One method of facilitating the chip-to-chip electrical connections is by using through-silicon vias (TSVs). A TSV is a vertical electrical connection that passes through a silicon wafer, allowing for more simplified interconnection of vertically aligned electronic devices, thereby significantly reducing integrated circuit layout complexity as well as overall dimensions of a multi-chip circuit. Some of the benefits associated with the interconnect technology enabled by 3D IC designs include accelerated data exchange, reduced power consumption, and much higher input/output voltage densities.

SUMMARY

One aspect of the present disclosure is a semiconductor structure.

According to some embodiments of the present disclosure, a semiconductor structure includes a first wafer, a conductive via, an isolation layer, and a spacer structure. The first wafer includes a semiconductor substrate, a multi-level interconnect structure, and a dielectric layer. The semiconductor substrate has a front side and a back side. The multi-level interconnect structure is disposed over the front side of the semiconductor substrate. The dielectric layer is disposed over the back side of the semiconductor substrate. The conductive via extends from the dielectric layer to a conductive line of the multi-level interconnect structure. The isolation layer is disposed between the conductive via and the first wafer. The spacer structure is disposed between the conductive via and the isolation layer, in which the spacer structure is spaced apart from the conductive line.

In some embodiments, the isolation layer has a straight portion and a tapered portion over the straight portion, the straight portion is disposed in the semiconductor substrate, and the tapered portion is in contact with the dielectric layer.

In some embodiments, the spacer structure is in contact with the tapered portion of the isolation layer, and the spacer structure is spaced apart from the straight portion of the isolation layer.

In some embodiments, the spacer structure is disposed between the tapered portion of the isolation layer and the conductive via.

In some embodiments, the isolation layer further includes a horizontal portion above the dielectric layer.

In some embodiments, the isolation layer is in contact with the conductive line.

In some embodiments, a top surface of the isolation layer and a top surface of the spacer structure are substantially coplanar.

In some embodiments, the isolation layer is made of a material substantially the same as a material of the spacer structure.

In some embodiments, the isolation layer is in contact with a first sidewall of the dielectric layer and a second sidewall of the semiconductor substrate, and the first sidewall of the dielectric layer is more slanted than the second sidewall of the semiconductor substrate.

In some embodiments, the conductive via includes a top portion, a bottom portion, and a neck portion between the top portion and the bottom portion, in which the neck portion has a width less than a width of the bottom portion.

In some embodiments, the bottom portion of the conductive via is spaced apart from the spacer structure.

In some embodiments, the top portion has a tapered profile.

In some embodiments, the semiconductor structure further includes a second wafer and a bonding layer. The second wafer is disposed over the front side of the semiconductor substrate of the first wafer. The bonding layer is disposed between the first wafer and the second wafer.

Another aspect of the present disclosure is a method of forming a semiconductor structure.

According to some embodiments of the present disclosure, a method of forming a semiconductor structure includes following steps. A second wafer is bonded to a first wafer, in which the first wafer includes a semiconductor substrate and a multi-level interconnect structure over a front side of the semiconductor substrate. The dielectric layer is formed on a back side of the semiconductor substrate. The dielectric layer, the semiconductor substrate, and the multi-level interconnect structure are etched to form an opening, such that a conductive line of the multi-level interconnect structure is exposed. An isolation layer is formed over the conductive line, a sidewall of the semiconductor substrate exposed by the opening, and a sidewall of the dielectric layer exposed by the opening. A spacer structure is formed over the isolation layer. An etching process is performed to remove a portion of the isolation layer over the conductive line. A conductive material is filled in the opening to form a conductive via.

In some embodiments, forming the spacer structure is performed such that a tapered portion of the isolation layer is in contact with the spacer structure, and a straight portion of the isolation layer is spaced apart from the spacer structure.

In some embodiments, forming the spacer structure is performed such that the spacer structure is over the dielectric layer.

In some embodiments, performing the etching process further includes removing a portion of the spacer structure over the dielectric layer.

In some embodiments, forming the isolation layer and forming the spacer structure are using different deposition processes.

In some embodiments, the isolation layer and the spacer structure are both oxide layers.

In some embodiments, forming the opening is performed such that the sidewall of the dielectric layer exposed by the opening is more slanted than the sidewall of the semiconductor substrate exposed by the opening.

In the aforementioned embodiments, since the spacer structure is disposed on the isolation layer, the leakage problem can be avoided. As a result, the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
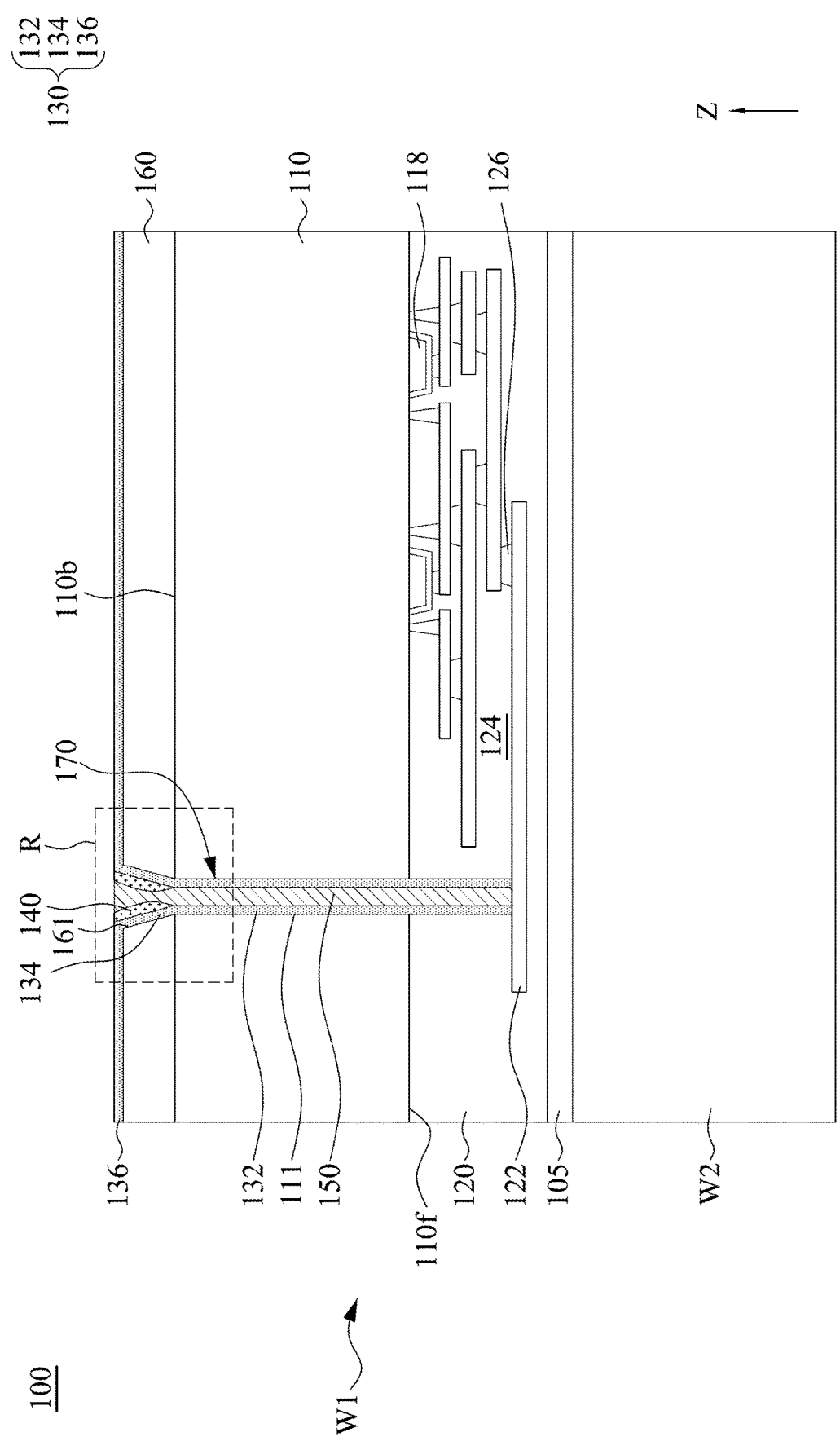
FIG. 1 is a cross-sectional view of a semiconductor structure in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
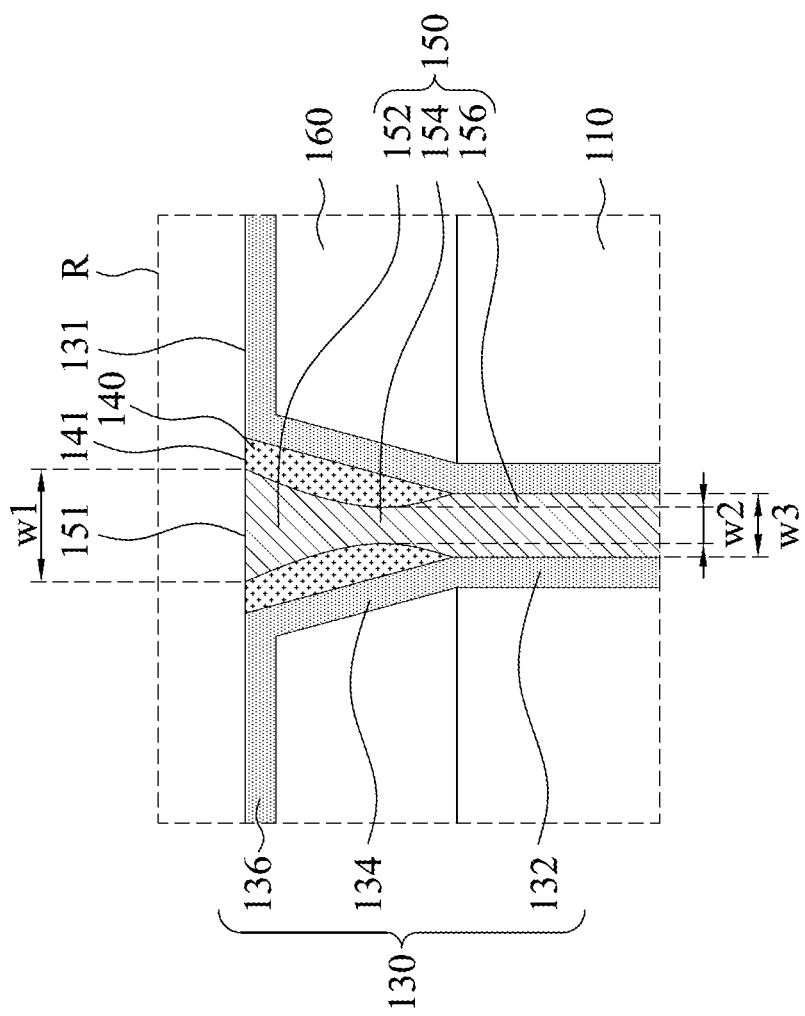
FIG. 2 is a partially enlarged view of FIG. 1.

FIG. 1 is a cross-sectional view of a semiconductor structure 100 in accordance with some embodiments of the present disclosure, and FIG. 2 is a partially enlarged view of a dashed-line region R in FIG. 1. Referring to FIG. 1 and FIG. 2, the semiconductor structure 100 includes a first wafer W1, a second wafer W2, a bonding layer 105, an isolation layer 130, a spacer structure 140, and a conductive via 150. The second wafer W2 is bonded to the first wafer W1 through the bonding layer 105.

In some embodiments, the first wafer W1 includes a semiconductor substrate 110, a plurality of devices 118, a multi-level interconnect structure 120, and a dielectric layer 160. The semiconductor substrate 110 has a front side 110*f* and a back side 110*b* opposite to the front side 110*f*. The devices 118 are disposed on the front side 110*f* of the semiconductor substrate 110. In some embodiments, the devices 118 may be active devices (e.g., transistors or diodes), passive devices (e.g., resistors or capacitors), or combinations thereof.

The multi-level interconnect structure 120 is disposed on the front side 110*f* of the semiconductor substrate 110 and connected to the devices 118. The multi-level interconnect structure 120 includes a plurality of conductive lines 122 that provide interconnections (wiring) between the devices 118, and between conductive lines 122 themselves. The conductive lines 122 may be insulated from each other by inter-metal dielectric (IMD) layers 124. The multi-level interconnect structure 120 may further include various conductive vias 126 disposed within the IMD layers 124 for connecting the conductive lines 122.

The dielectric layer 160 is disposed on the back side 110*b* of the semiconductor substrate 110. In some embodiments, at least one opening 170 passes through the dielectric layer 160, the semiconductor substrate 110, and a portion of the multi-level interconnect structure 120, such that the opening 170 exposes a sidewall 111 of the semiconductor substrate 110 and a sidewall 161 of the dielectric layer 160. In some embodiments, the opening 170 has different profiles in the dielectric layer 160 and in the semiconductor substrate 110. For example, the opening 170 has a tapered profile in the dielectric layer 160 and has a substantially straight profile in the semiconductor substrate 110.

The isolation layer 130 is disposed on the sidewall 161 of the dielectric layer 160 and the sidewall 111 of the semiconductor substrate 110. In some embodiments, the isolation layer 130 further extends to a top surface of the dielectric layer 160. The isolation layer 130 is conformal to the sidewalls 161 and 111. For example, the isolation layer 130 has a straight portion 132 in contact with the semiconductor substrate 110 and the multi-level interconnect structure 120 and a tapered portion 134 in contact with the dielectric layer 160. It is noted that the term of "straight" herein means that the straight portion 132 is straighter than the tapered portion 134 in a z-axis direction. An extending direction of the straight portion 132 is not necessary to be parallel to the z-axis direction. In some embodiments, the isolation layer 130 further includes a horizontal portion 136 over the top surface of the dielectric layer 160.

The spacer structure 140 is disposed on the isolation layer 130. For example, the spacer structure 140 is in contact with the tapered portion 134 of the isolation layer 130. In some embodiments, the spacer structure 140 is spaced apart from the straight portion 132 of the isolation layer 130. In some other embodiments, the spacer structure 140 is in contact with a top of the straight portion 132 of the isolation layer 130 and spaced apart from a bottom of the straight portion 132 of the isolation layer 130. That is, the spacer structure 140 is spaced apart from the conductive line 122 exposed by the opening 170.

The conductive via 150 is disposed on the conductive line 122 exposed by the opening 170 and in the semiconductor substrate 110 and the dielectric layer 160. That is, the conductive via 150 is electrically connected to the conductive line 122 exposed by the opening 170. The conductive via 150 is further in contact with the straight portion 132 of the isolation layer 130 and the spacer structure 140 but spaced apart from the tapered portion 134 and the horizontal portion 136 of the isolation layer 130. As shown in FIG. 2, the conductive via 150 includes a top portion 152, a bottom portion 156, and a neck portion 154 between the top portion 152 and the bottom portion 156. The top portion 152 and the neck portion 154 are disposed in the dielectric layer 160, and the bottom portion 156 is disposed in the semiconductor substrate 110. In some embodiments, a width w1 of the top portion 152 is tapered. The top portion 152 has a (maximum) width w1. The neck portion 154 has a (minimum) width w2 less than a width w3 of the bottom portion 156. The width w2 of the neck portion 154 is also less than the width w1 of the top portion 152. In other word, the width w2 of the neck portion 154 is narrower than the width w1 of the top portion 152 and the width w3 of the bottom portion 156. In some embodiments, a width variation of the bottom portion 156 is less than a width variation of the neck portion 154, and also less than a width variation of the top portion 152. For example, the width w2 of the bottom portion 156 is substantially unchanged. In other words, the bottom portion 156 has a strip profile, and the top portion 152 has a tapered profile. In some embodiments, the top portion 152 and the neck portion 154 of the conductive via 150 are in contact with the spacer structure 140, while the bottom portion 156 of the conductive via 150 is spaced apart from the spacer structure 140.

In some embodiments, a top surface 131 of the isolation layer 130, a top surface 141 of the spacer structure 140, and a top surface 151 of the conductive via 150 are substantially coplanar. In some embodiments, the spacer structure 140 is disposed between the tapered portion 134 of the isolation layer 130 and the conductive via 150. In the present embodiments, the conductive via 150 may be referred as a through-substrate via or through-silicon via (TSV).

Since the spacer structure 140 is disposed on the isolation layer 130, the isolation layer 130 can remain on the sidewall 111 of the semiconductor substrate 110 during an etching process, which will be described in detail in the following paragraphs. As a result, the leakage problem (e.g., the conductive via 150 to the semiconductor substrate 110 leakage) can be improved or avoided.

FIGS. 3-7 are cross-sectional views of a method of forming the semiconductor structure 100 of FIG. 1 at various stages in accordance with some embodiments of the present disclosure.

Figure 3:
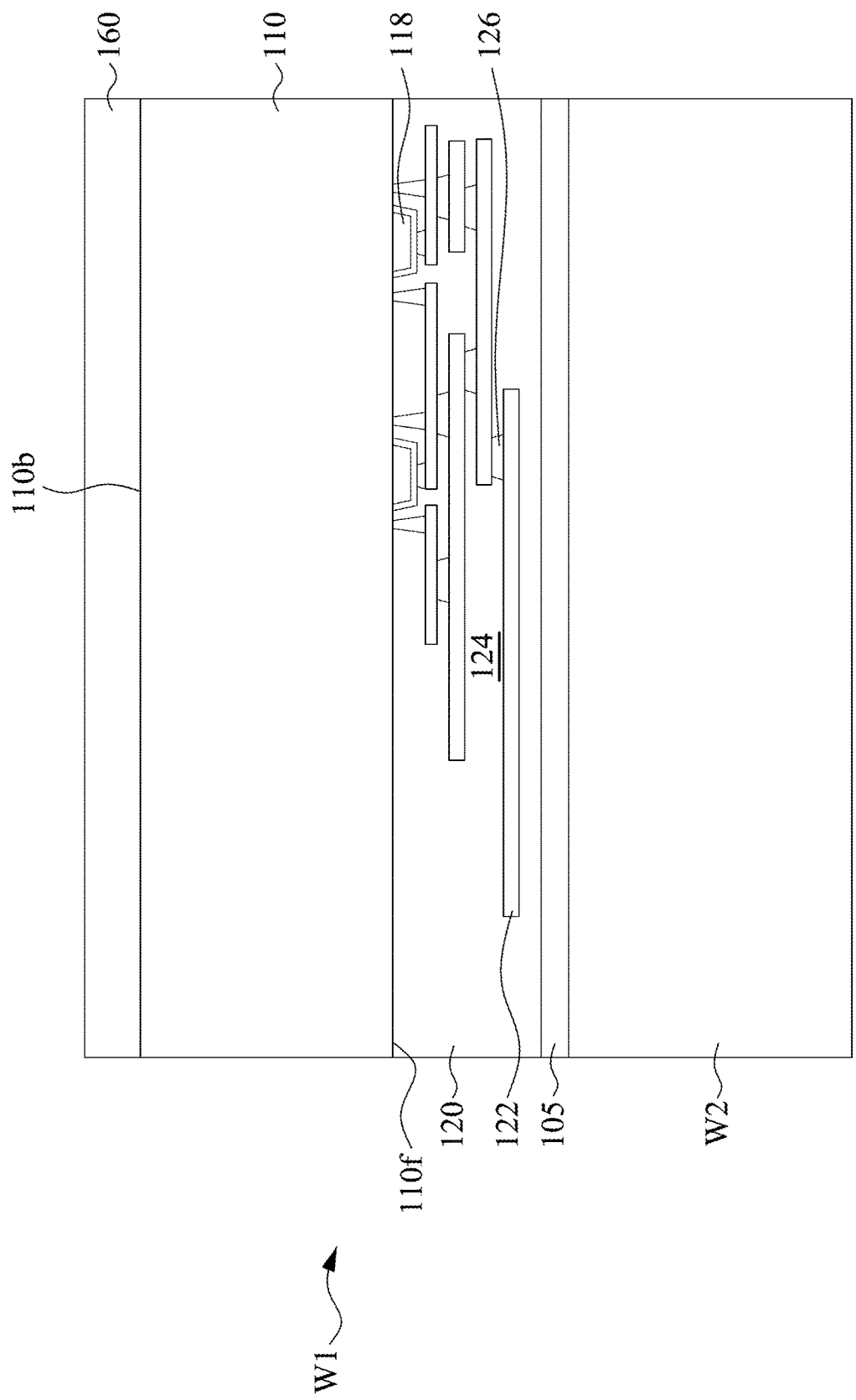
FIGS. 3-7 are cross-sectional views of a method of forming the semiconductor structure at various stages in accordance with some embodiments of the present disclosure.

Referring to FIG. 3, the second wafer W2 is bonded on the front side 110f of the first wafer W1. In some embodiments, the bonding layer 105 is disposed between the first wafer W1 and the second wafer W2 for fusion bonding. For example, the bonding layer 105 is disposed on the first wafer W1, and then the second wafer W2 is bonded on the first wafer W1 through the bonding layer 105. However, embodiments of the present disclosure are not limited thereto. In some embodiments, the second wafer W2 is bonded on the first wafer W1 by an anodic bonding process or an adhesive bonding process.

In some embodiments, the second wafer W2 is a semiconductor material and may include structures including a graded layer or a buried oxide, for example. In some embodiments, the second wafer W2 includes bulk silicon that may be undoped or doped (e.g., p-type, n-type, or a combination thereof). Other materials that are suitable for semiconductor device formation may be used. Other materials, such as, fused silica, germanium, quartz, sapphire, and glass could alternatively be used for the second wafer W2. In some embodiments, the bonding layer 105 is a dielectric layer, e.g., an oxide layer or other suitable materials.

The first wafer W1 includes the semiconductor substrate 110, the devices 118, and the multi-level interconnect structure 120. The semiconductor substrate 110 includes an elementary semiconductor, such as germanium, or silicon; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the devices 118 are formed on the front side 110f of the semiconductor substrate 110, and the multi-level interconnect structure 120 is formed above the devices 118. The multi-level interconnect structure 120 includes conductive lines 122, IMD layers 124, and conductive vias 126. The IMD layers 124 may be made of silicon oxide ($SiO_2$), silicon nitride (SiN), silicon oxynitride (SiON), or other suitable materials.

After the second wafer W2 is bonded on the first wafer W1, the dielectric layer 160 may be formed on the back side 110b of the semiconductor substrate 110. The dielectric layer 160 may be made of silicon oxide ($SiO_2$), silicon nitride (SiN), silicon oxynitride (SiON), or other suitable materials.

Figure 4:
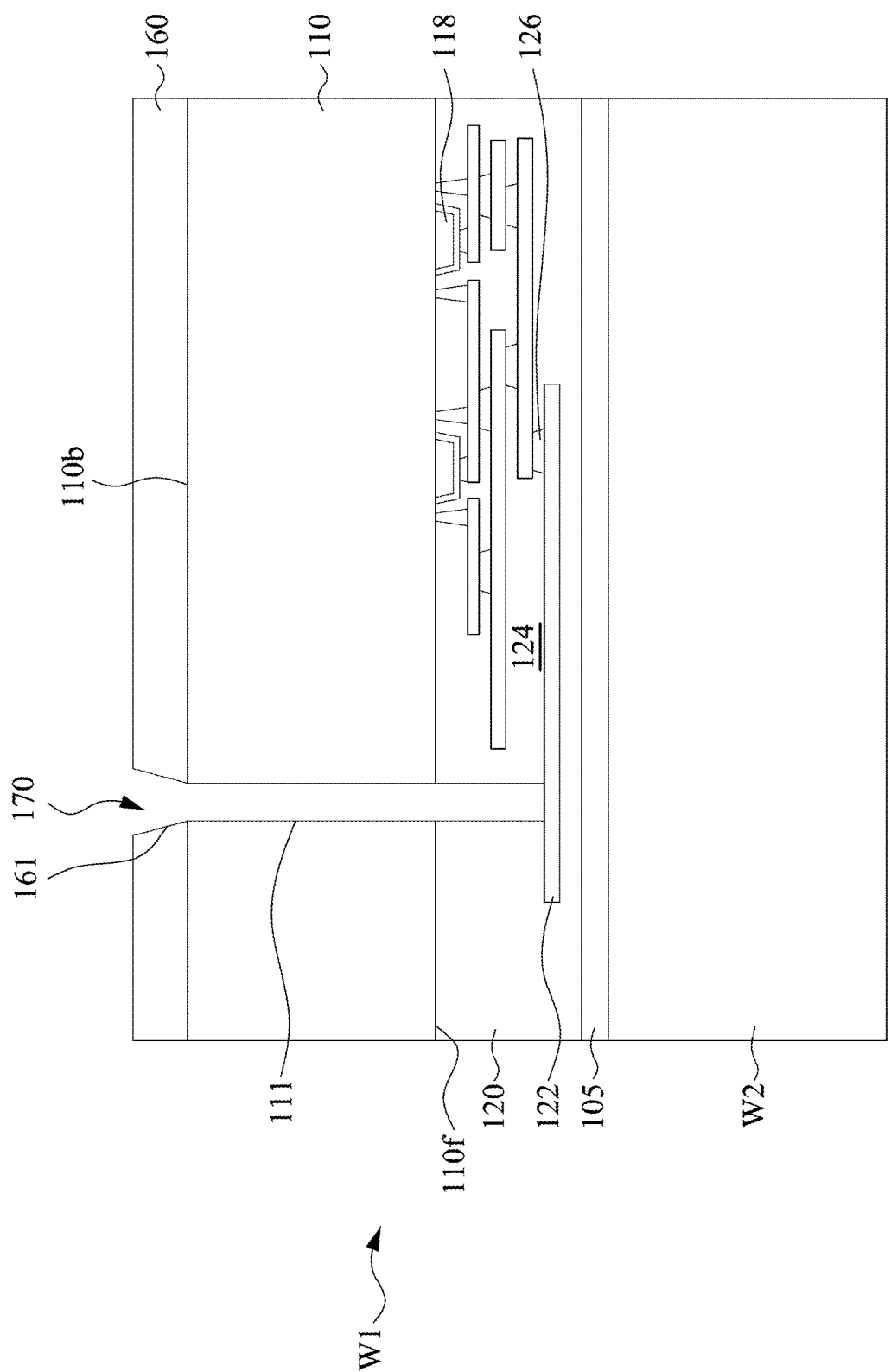

Referring to FIG. 4, after the dielectric layer 160 is formed, the dielectric layer 160, the semiconductor substrate 110, and the multi-level interconnect structure 120 are etched to form an opening 170, such that one of the conductive line 122 is exposed through the opening 170. In greater details, the sidewall 111 of the semiconductor substrate 110 and the sidewall 161 of the dielectric layer 160 are exposed through the opening 170. Since the dielectric layer 160 and the semiconductor substrate 110 include different materials, the etching profile of the opening 170 is different in the dielectric layer 160 and the semiconductor substrate 110. For example, the opening 170 has a tapered profile in the dielectric layer 160 and has a substantially straight profile in the semiconductor substrate 110. In other words, the sidewall 161 of the dielectric layer 160 is more slanted than the sidewall 111 of the semiconductor substrate 110. In some embodiments, the dielectric layer 160, the semiconductor substrate 110, and the multi-level interconnect structure 120 may be etched by using either dry or wet etching method. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like.

Figure 5:
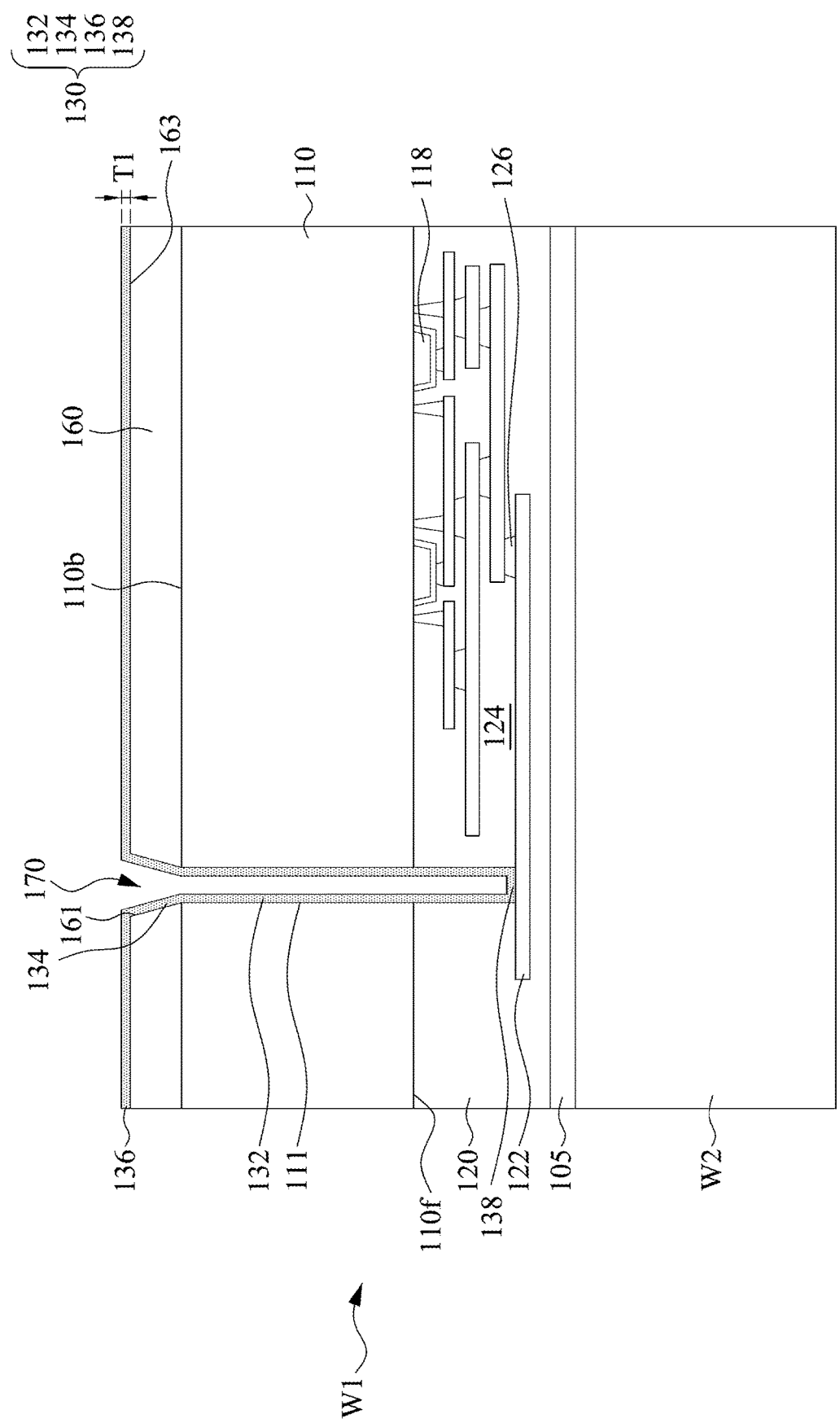

Referring to FIG. 5, after the dielectric layer 160, the semiconductor substrate 110, and the multi-level interconnect structure 120 are etched, the isolation layer 130 is conformally formed on the conductive line 122 and the sidewall 111 of the semiconductor substrate 110. In greater details, the isolation layer 130 is also formed on the sidewall 161 of the dielectric layer 160 and formed over the dielectric layer 160. The isolation layer 130 has the bottom portion 138, the straight portion 132 over the bottom portion 138, the tapered portion 134 over the straight portion 132, and the horizontal portion 136 over the tapered portion 134. The bottom portion 138 of the isolation layer 130 is in contact with the conductive line 122, the straight portion 132 of the isolation layer 130 is in contact with the sidewall 111 of the semiconductor substrate 110, the tapered portion 134 of the isolation layer 130 is in contact with the sidewall 161 of the dielectric layer 160, and the horizontal portion 136 of the isolation layer 130 is in contact with a top surface 163 of the dielectric layer 160. In some embodiments, the isolation layer 130 has a thickness T1 in a range of about 100 nm to about 800 nm. For example, the thickness T1 of the isolation layer 130 is about 400 nm. In some embodiments, the isolation layer 130 is made of oxide, such as silicon oxide ($SiO_2$), or other suitable materials.

Figure 6:
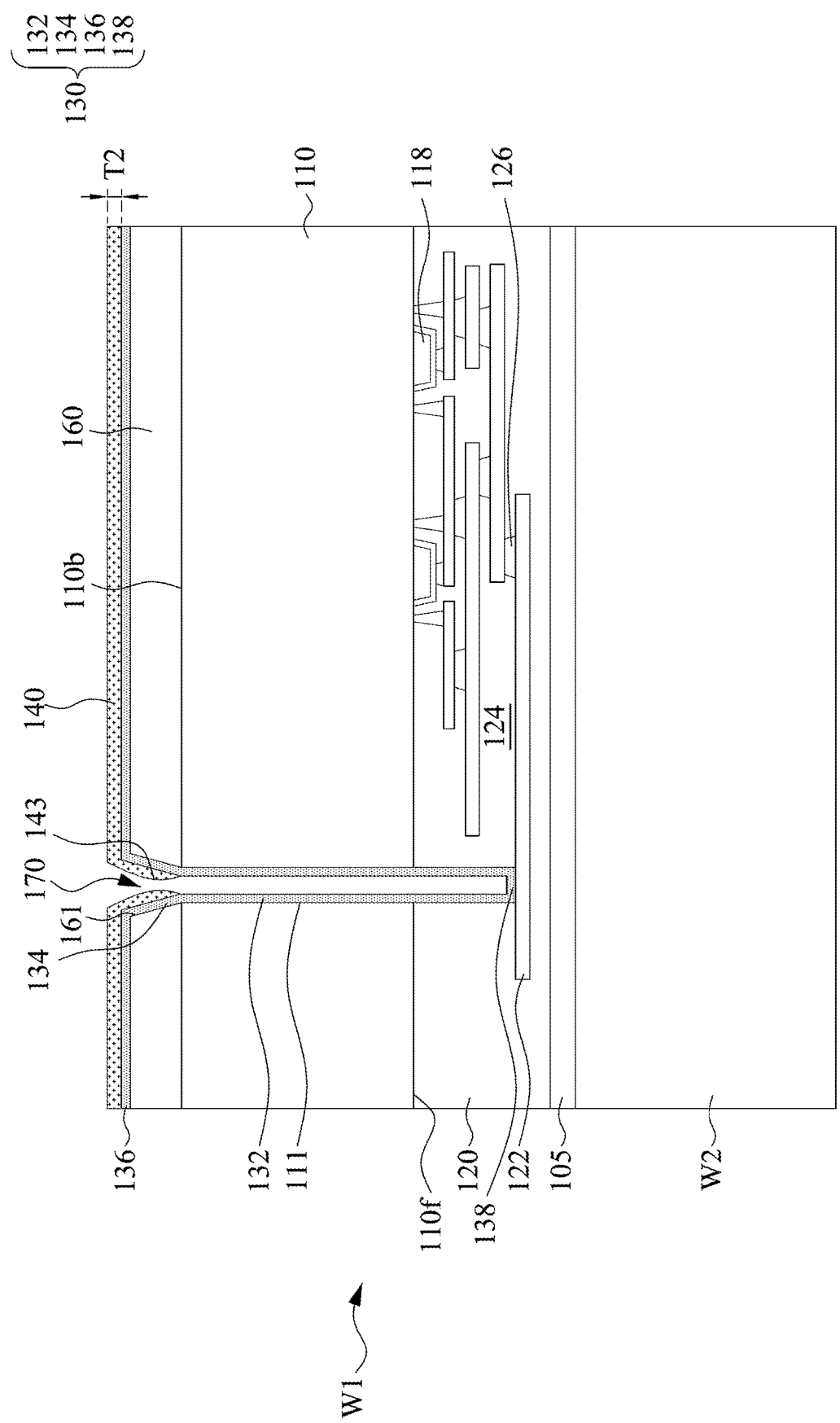

Referring to FIG. 6, after the isolation layer 130 is formed, the spacer structure 140 is formed over the isolation layer 130. In greater details, the spacer structure 140 is formed over the dielectric layer 160. In some embodiments, the tapered portion 134 of the isolation layer 130 is in contact with the spacer structure 140, and the straight portion 132 of the isolation layer 130 is spaced apart from the spacer structure 140.

In some embodiments, forming the isolation layer 130 and forming the spacer structure 140 are using different deposition processes. For example, the isolation layer 130 may be formed using an atomic layer deposition (ALD) process, or other suitable processes. The spacer structure 140 may be formed using a plasma-enhanced chemical vapor deposition (PECVD) process, or other suitable processes. The ALD process can provide better step coverage than PECVD. Step coverage, also known as shadowing, refers to the level of uniformity of thickness of a thin film deposited on a surface that is non-planar or three-dimensional (e.g., includes a step or other irregularity). For example, the spacer structure 140 is not formed on the straight portion 132 of the isolation layer 130 indicating relatively poor step coverage (e.g., due to the PECVD process used to deposit the spacer structure 140). The spacer structure 140 may have a curved surface 143. By contrast, the isolation layer 130 may be referred as a thin film and formed on the sidewall 111 of the semiconductor substrate 110 and the sidewall 161 of the dielectric layer 160 indicating relatively good step coverage (e.g., due to the ALD process used to deposit the isolation layer 130). In some embodiments, a thickness T2 of the spacer structure 140 is greater than the thickness T1 of the isolation layer 130. In some embodiments, the thickness T2 of the spacer structure 140 is in a range of about 500 nm to about 3000 nm. For example, the thickness T2 of the spacer structure 140 is about 1500 nm.

In some embodiments, the isolation layer 130 and the spacer structure 140 are made of the same materials. For example, the isolation layer 130 and the spacer structure 140 are made of oxide, such as silicon oxide ($SiO_2$), or other suitable materials. In some other embodiments, the isolation layer 130 and the spacer structure 140 are made of different materials.

Figure 7:
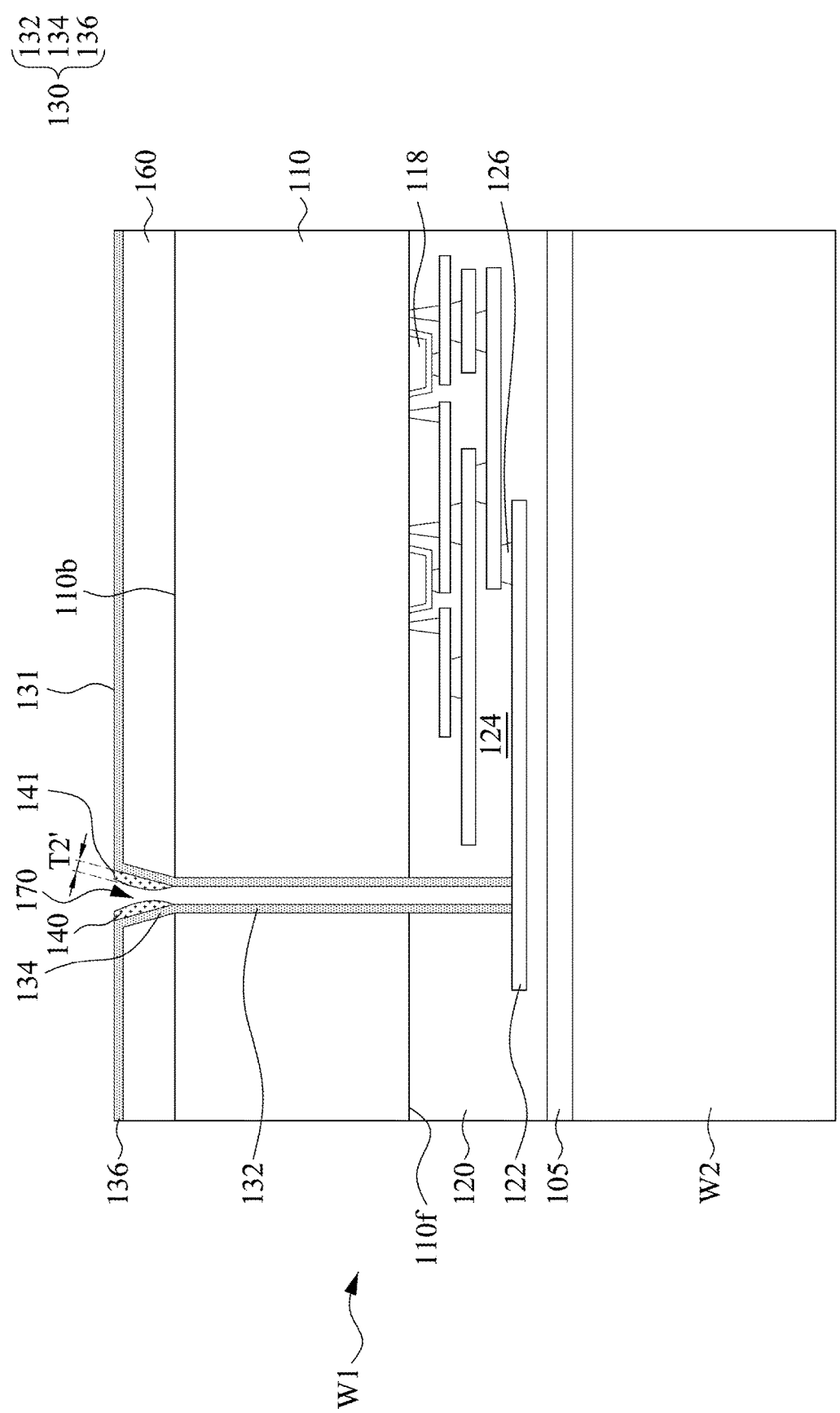

Referring to FIG. 7, after the spacer structure 140 is formed, an etching process is performed to remove the bottom portion 138 (see FIG. 6) of the isolation layer 130 on the conductive line 122. In other words, the bottom portion 138 (see FIG. 6) of the isolation layer 130 is removed, and the conductive line 122 is exposed through the opening 170. The etching process further includes removing portions of the spacer structure 140 over the dielectric layer 160. For example, most of the isolation layer 130 and the spacer structure 140 are removed from exposed horizontal surfaces, leaving the isolation layer 130 and the spacer structure 140 on vertical surfaces such as the sidewall 111 of the semiconductor substrate 110. Further, a portion of the spacer structure 140 on the tapered portion 134 of the isolation layer 130 is not removed and protects the tapered portion 134 of the isolation layer 130 from being etched. In some embodiments, the etching process is a punch etch process using a dry etching process such as a reactive ion etching (RIE) process, sputter etching process, or other suitable processes. After the etching process, the thickness T2' of the spacer structure 140 is equal to or less than the thickness T2 of the spacer structure 140 (see FIG. 6). In some embodiments, the thickness T2' of the spacer structure 140 is less than about 500 nm. In other embodiments, the thickness T2' of the spacer structure 140 is less than about 3000 nm.

Since the sidewall 161 is more slanted than the sidewall 111 of the semiconductor substrate 110, the tapered portion 134 of the isolation layer 130 is easier to be etched than the straight portion 132 of the isolation layer 130 without the spacer structure 140. If the tapered portion 134 is etched, the back side 110b of the semiconductor substrate 110 may be exposed, and a leakage issue may occur between the conductive via 150 (see FIG. 1) and the semiconductor substrate 110. In FIG. 6, however, since the spacer structure 140 is formed on the isolation layer 130, especially on the tapered portion 134 of the isolation layer 130, the spacer structure 140 protects the isolation layer 130 such that the tapered portion 134 of the isolation layer 130 is not etched during the etching process. Hence, the leakage problem between the conductive via 150 and the semiconductor substrate 110 can be improved or avoided.

Referring back to FIG. 1, after the etching process is performed, a conductive material is filled in the opening 170, and a planarization process, e.g., a CMP process, is performed to remove excess portions of the conductive material outside the opening 170, such that the conductive via 150 is formed in the remaining opening 170. In greater details, the conductive via 150 is formed on the conductive line 122 and formed in a portion of the multi-level interconnect structure 120, the semiconductor substrate 110 and the dielectric layer 160. As a result, the semiconductor structure 100 as shown in FIG. 1 can be obtained.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
    a first wafer comprising:
        a semiconductor substrate having a front side and a back side;
        a multi-level interconnect structure over the front side of the semiconductor substrate; and
        a dielectric layer over the back side of the semiconductor substrate;
    a conductive via extending from the dielectric layer to a conductive line of the multi-level interconnect structure;
    an isolation layer between the conductive via and the first wafer; and
    a spacer structure between the conductive via and the isolation layer, wherein the spacer structure is spaced apart from the conductive line.

2. The semiconductor structure of claim 1, wherein the isolation layer has a straight portion and a tapered portion over the straight portion, the straight portion is in the semiconductor substrate, and the tapered portion is in contact with the dielectric layer.

3. The semiconductor structure of claim 2, wherein the spacer structure is in contact with the tapered portion of the isolation layer, and the spacer structure is spaced apart from the straight portion of the isolation layer.

4. The semiconductor structure of claim 2, wherein the spacer structure is between the tapered portion of the isolation layer and the conductive via.

5. The semiconductor structure of claim 2, wherein the isolation layer further comprises a horizontal portion above the dielectric layer.

6. The semiconductor structure of claim 1, wherein the isolation layer is in contact with the conductive line.

7. The semiconductor structure of claim 1, wherein a top surface of the isolation layer and a top surface of the spacer structure are substantially coplanar.

8. The semiconductor structure of claim 1, wherein the isolation layer is made of a material substantially the same as a material of the spacer structure.

9. The semiconductor structure of claim 1, wherein the isolation layer is in contact with a first sidewall of the dielectric layer and a second sidewall of the semiconductor substrate, and the first sidewall of the dielectric layer is more slanted than the second sidewall of the semiconductor substrate.

10. The semiconductor structure of claim 1, wherein the conductive via comprises:
    a top portion;

a bottom portion; and a neck portion between the top portion and the bottom portion, wherein the neck portion has a width less than a width of the bottom portion.

11. The semiconductor structure of claim 10, wherein the bottom portion of the conductive via is spaced apart from the spacer structure.

12. The semiconductor structure of claim 10, wherein the top portion has a tapered profile.

13. The semiconductor structure of claim 1, further comprising:

a second wafer over the front side of the semiconductor substrate of the first wafer; and a bonding layer between the first wafer and the second wafer.

14. A method of forming a semiconductor structure, comprising:

bonding a second wafer to a first wafer, wherein the first wafer comprises a semiconductor substrate and a multi-level interconnect structure over a front side of the semiconductor substrate;

forming a dielectric layer on a back side of the semiconductor substrate;

etching the dielectric layer, the semiconductor substrate, and the multi-level interconnect structure to form an opening, such that a conductive line of the multi-level interconnect structure is exposed;

forming an isolation layer over the conductive line, a sidewall of the semiconductor substrate exposed by the opening, and a sidewall of the dielectric layer exposed by the opening;

forming a spacer structure over the isolation layer such that a tapered portion of the isolation layer is in contact with the spacer structure, and a straight portion of the isolation layer is spaced apart from the spacer structure;

performing an etching process to remove a portion of the isolation layer over the conductive line; and filling a conductive material in the opening to form a conductive via.

15. The method of forming the semiconductor structure of claim 14, wherein forming the spacer structure is performed such that the spacer structure is over the dielectric layer.

16. The method of forming the semiconductor structure of claim 15, wherein performing the etching process further comprises removing a portion of the spacer structure over the dielectric layer.

17. The method of forming the semiconductor structure of claim 14, wherein forming the isolation layer and forming the spacer structure are using different deposition processes.

18. The method of forming the semiconductor structure of claim 14, wherein the isolation layer and the spacer structure are both oxide layers.

19. The method of forming the semiconductor structure of claim 14, wherein forming the opening is performed such that the sidewall of the dielectric layer exposed by the opening is more slanted than the sidewall of the semiconductor substrate exposed by the opening.

* * * * *